(12) United States Patent
Liu

(10) Patent No.: US 7,786,802 B2
(45) Date of Patent: Aug. 31, 2010

(54) OUTPUT STAGE CIRCUIT AND OPERATIONAL AMPLIFIER THEREOF

(75) Inventor: Chang-Shun Liu, Taipei (TW)

(73) Assignee: Realtek Semiconductor Corp., Hsinchu (TW)

( * ) Notice: Subject to any disclaimer, the term of this patent is extended or adjusted under 35 U.S.C. 154(b) by 2 days.

(21) Appl. No.: 12/265,361

(22) Filed: Nov. 5, 2008

(65) Prior Publication Data

US 2009/0115527 A1    May 7, 2009

(30) Foreign Application Priority Data

Nov. 6, 2007    (TW) ............... 96141792 A

(51) Int. Cl.
*H03F 3/45* (2006.01)
(52) U.S. Cl. .............. 330/255; 330/261; 330/264; 330/302
(58) Field of Classification Search ........ 330/255, 330/261, 264, 302
See application file for complete search history.

(56) References Cited

U.S. PATENT DOCUMENTS

| | | | | |
|---|---|---|---|---|
| 4,570,128 | A * | 2/1986 | Monticelli | 330/267 |
| 4,731,589 | A * | 3/1988 | Preslar | 330/271 |
| 5,285,168 | A * | 2/1994 | Tomatsu et al. | 330/253 |
| 5,805,021 | A * | 9/1998 | Brehmer | 330/253 |
| 6,753,731 | B2 * | 6/2004 | Maki | 330/255 |
| 7,170,351 | B2 * | 1/2007 | Shimatani | 330/255 |

OTHER PUBLICATIONS

Monticelli, Dennis M., "A Quad CMOS Single-Supply Op Amp with Rail-to-Rail Output Swing," IEEE Journal of Soild State Circuits, Dec. 1986, pp. 1026-1034, vol. sc-21, No. 6.
De Langen et al., "Compact Low-Voltage Power-Efficient Operational Amplifier Cells for VLSI," IEEE Journal of Solid State Circuits Oct. 1998, pp. 1482-1496, vol. 33, No. 10.

* cited by examiner

*Primary Examiner*—Patricia Nguyen
(74) *Attorney, Agent, or Firm*—Muncy, Geissler, Olds & Lowe, PLLC

(57) ABSTRACT

The present invention relates to an output stage circuit and an operational amplifier thereof. In the output stage circuit, one of a gate of a transistor is coupled to a gate of a bias transistor and a level shifter in response to a small signal outputted from an amplifying circuit in the operational amplifier. In addition, a gate voltage of the bias transistor is controlled by a voltage generating circuit to control a DC bias of the transistor of the output stage circuit. Therefore, there is no need extra frequency compensating component for compensating the transistor of the output stage circuit, and to save circuit layout area and cost can be achieved by the present invention.

13 Claims, 4 Drawing Sheets

OUTPUT STAGE CIRCUIT AND OPERATIONAL AMPLIFIER THEREOF

This application claims the benefit of the filing date of Taiwan Application Ser. No. "096141792", filed on "Nov. 6, 2007", the content of which is incorporated herein by reference.

BACKGROUND OF THE INVENTION

1. Field of the Invention

The present invention relates to an amplifier, and more particularly, to an output stage circuit and an operational amplifier thereof.

2. Description of the Related Art

In analog circuit, an output stage circuit plays a role of driving a load in the condition of less gain decreasing.

FIG. 1 illustrates a circuit diagram depicting a complementary metal-oxide semiconductor (CMOS) operational amplifier with class AB output stage 100 in the prior art. Referring to FIG. 1, the operational amplifier 10 includes a class AB output stage 100, two resistors R10 and R11, two capacitors C10 and C11, an amplifying circuit A10 and a bias circuit B10, wherein the bias circuit B10 includes two sub bias circuits B10-1 and B10-2. For the explanation of the operation of the operational amplifier 10, in this circuit diagram, and a plurality of nodes A, B, X and Y are marked out. The sub bias circuits B10-1 and B10-2 respectively control voltages of nodes A and B through the current sources IB1 and IB2 therein, so as to respectively control the bias voltages of nodes X and Y. Thus, the bias current Iout of the class AB output stage 100 is proportional to the currents of IB1 and IB2.

The bias method of the class AB output stage 100 has advantages of fast frequency response and simple circuit configuration. However, the folded-cascode FC configuration has to be used in this circuit and the transistors 101 and 102 in the class AB output stage respectively need resistors and capacitors (R10, C10) and (R11, C11). According to the description above, apparently the circuit at least has two limitation:

1. Two sets of resistor and capacitor (R10, C10) and (R11, C11) should be used in this circuit, and such utilization in an integrated circuit will occupy a lot of layout area, and resistance and capacitance thereof in the integrated circuit are inaccurate.

2. When a higher supply voltage, such as 5V, is applied to this circuit, a folded-cascode configuration FC must be used in the bias circuit B10. Thus, this circuit cannot be applied to simple two stage amplifier.

SUMMARY OF THE INVENTION

The present invention is direct to an output stage circuit for reducing the circuit layout area In addition, the present invention is directed to an operational amplifier to reduce the passive element.

To achieve the above-mentioned object and others, an output stage circuit adapted enhancing a driving capability of an output signal outputted from an amplifying circuit is provided in the present invention. The output stage circuit includes a first transistor, a second transistor, a third transistor, a level shifter, a frequency compensating circuit and a voltage generator. A first source/drain terminal of the first transistor is coupled to a first common voltage. A first source/drain terminal of the second transistor is coupled to a second source/drain terminal of the first transistor. A second source/drain terminal of the second transistor is coupled to a second common voltage. A gate terminal of the second transistor is coupled to an output terminal of the amplifying circuit. The level shifter includes a first terminal, a second terminal and a third terminal. The first terminal thereof is coupled to the output terminal of the amplifying circuit and receives the output signal. The second terminal thereof is coupled to the second common voltage. The level shifter is for shifting a direct current (DC) bias of the output terminal of the amplifying circuit a preset voltage, and responding the output signal to the third terminal thereof. The frequency compensating circuit is coupled to and between the first source/drain terminal of the second transistor and the gate terminal of the second transistor. A first source/drain terminal of the third transistor is coupled to the third terminal of the level shifter. A second source/drain terminal of the third transistor is coupled to the first common voltage. The voltage generator is for outputting a control voltage to the gate terminal of the third transistor to control a voltage of the first source/drain terminal of the third transistor in order to control a current flow through the first and the second transistors.

An operational amplifier is provided in the present invention. The operational amplifier includes an amplifying circuit and an output stage circuit, wherein the output stage circuit includes a first transistor, a second transistor, a third transistor, a level shifter, a frequency compensating circuit and a voltage generator. An output terminal of the amplifying circuit outputs an output signal. A first source/drain terminal of the first transistor is coupled to a first common voltage. A first source/drain terminal of the second transistor is coupled to a second source/drain terminal of the first transistor. A second source/drain terminal of the second transistor is coupled to a second common voltage. A gate terminal of the second transistor is coupled to an output terminal of the amplifying circuit. The level shifter includes a first terminal, a second terminal and a third terminal. The first terminal thereof is coupled to the output terminal of the amplifying circuit and receives the output signal. The second terminal thereof is coupled to the second common voltage. The level shifter is for shifting a direct current (DC) bias of the output terminal of the amplifying circuit a preset voltage, and responding the output signal to the third terminal thereof. The frequency compensating circuit is coupled to and between the first source/drain terminal of the second transistor and the gate terminal of the second transistor. A first source/drain terminal of the third transistor is coupled to the third terminal of the level shifter. A second source/drain terminal of the third transistor is coupled to the first common voltage. The voltage generator is for outputting a control voltage to the gate terminal of the third transistor to control a voltage of the first source/drain terminal of the third transistor in order to control a current flow through the first and the second transistors.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

EMBODIMENT OF THE INVENTION

Figure 1:
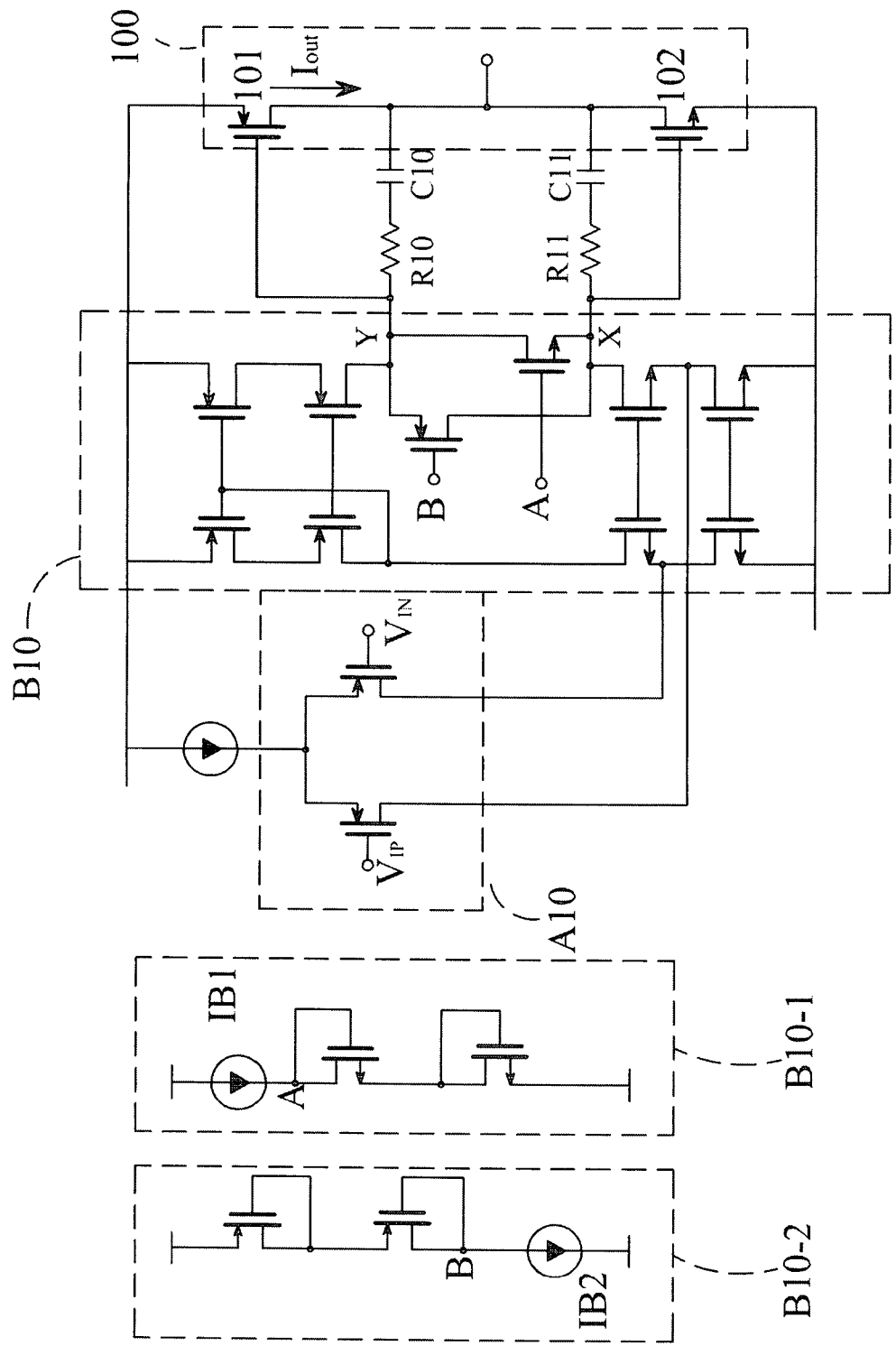
FIG. 1 illustrates a circuit diagram depicting an operational amplifier with a class AB output stage circuit in the prior art.
Figure 2:
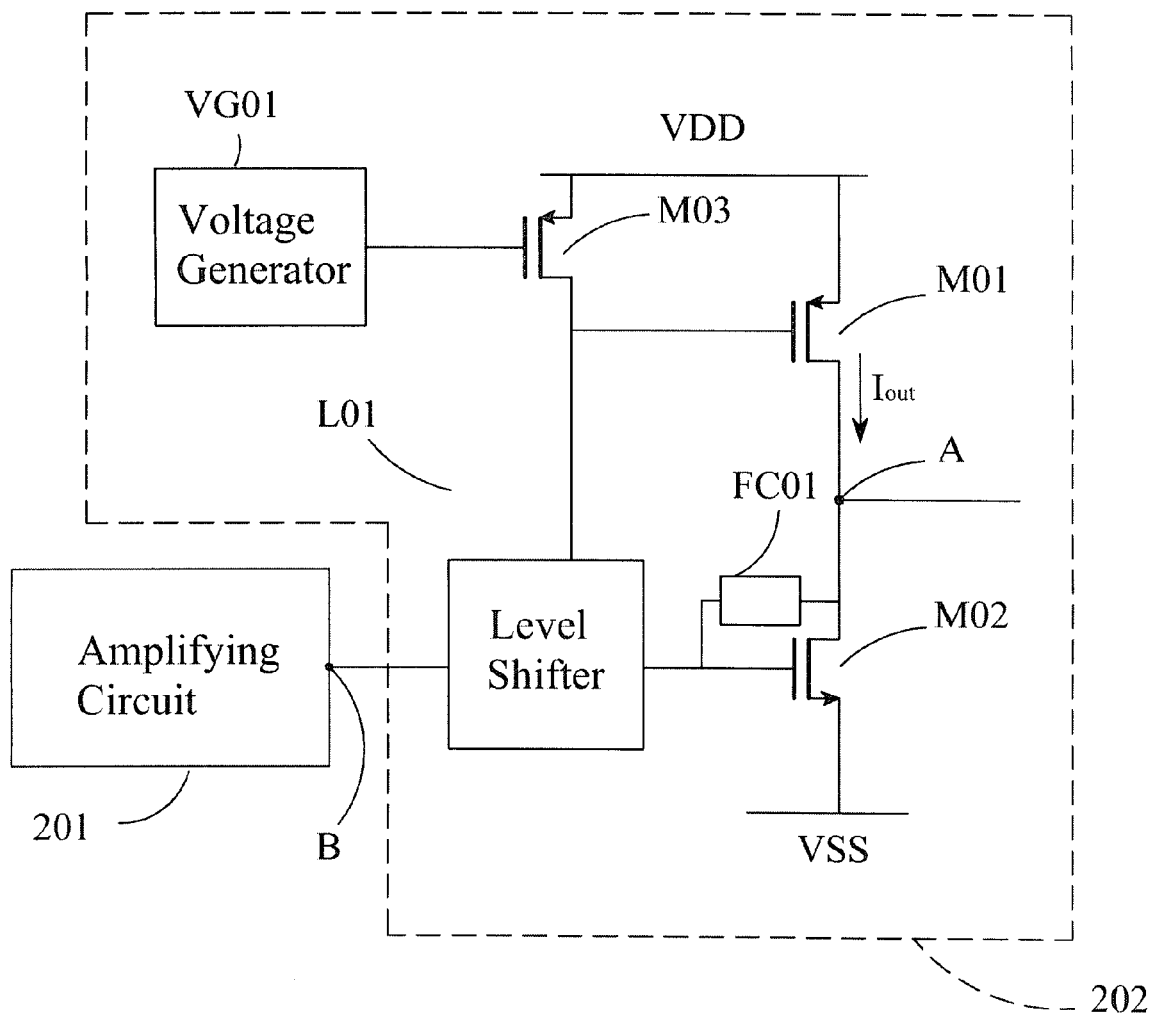
FIG. 2 illustrates a circuit diagram depicting an operational amplifier according to an embodiment in the present invention.

FIG. 2 illustrates a circuit diagram depicting an operational amplifier according to an embodiment of the present invention. Referring to FIG. 2, the operational amplifier 21 includes an amplifying circuit 201 and an output stage circuit 202, wherein the output stage circuit 202 includes a first transistor M01, a second transistor M02, a third transistor M03, a level shifter L01, a frequency compensating circuit FC01 and a voltage generator VG01. In addition, In order to illustrate the embodiment of the present invention, a node A, a node B, a first common voltage VDD and a second common voltage VSS is further shown in FIG. 2. Generally, the common voltage VDD is a power source voltage, the common voltage VSS is a ground voltage, nevertheless, the present invention is not limited to this embodiment. The first transistor M01 and the second transistor M02 of the output stage circuit 202 is used for driving a load. In the embodiment, for keeping uniformity between the signal outputted from the node A of the first transistor M01 and the second transistor M02 in the output stage circuit 202 and the output signal outputted from the amplifying circuit 201, the first transistor M01 and the second transistor M02 have to conform to the following conditions:

1. The first transistor M01 and the second transistor M02 should be operated in the saturation region.
2. The direct current (DC) biases between the source and the drain of the first transistor M01 and the second transistor M02 should be predictable.

The voltage of the output terminal of the amplifying circuit 201 (node B) is offset a preset voltage to provide a DC bias to the gate terminal of the first transistor M01 and the gate terminal of the first transistor M01 responds to the output signal of the amplifying circuit 201. In this embodiment, the circuit applied to the level shifter L01 has higher bandwidth and wider frequency response. According to the above-mentioned characteristic, it is no longer necessary to add an extra frequency compensating circuit between the gate terminal of the transistor M01 and the drain terminal of the transistor M01. In addition, the drain terminal of the transistor M03 is coupled to the gate terminal of the transistor M01 to ensure that the DC bias current Iout of the transistors M01 and M03 can be predictable and accurate, where the gate voltage of the third transistor M03 is controlled by the voltage generator VG10. In other words, the voltage generator VG10 outputs a control voltage Vc to the gate terminal of the third transistor M03 to control the drain voltage of the third transistor M03, so that the control over the DC bias current Iout flowing through the first and the second transistors can be achieved, and the DC bias current Iout can be predictable and accurate.

Figure 3:
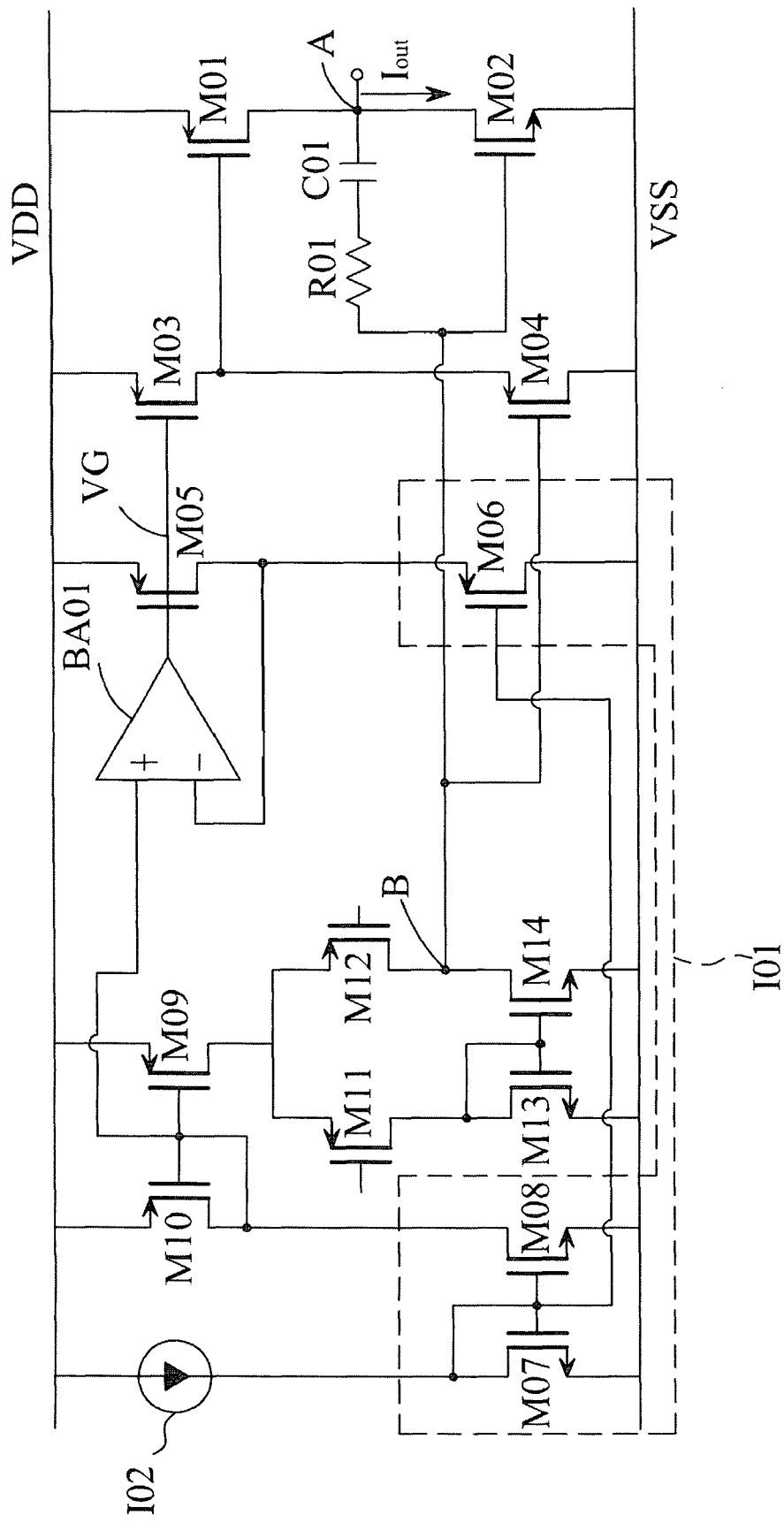
FIG. 3 illustrates a detail circuit diagram of the operational amplifier 21 according to an embodiment of the present invention.

FIG. 3 illustrates a detail circuit diagram of the operational amplifier 21 according to an embodiment in the present invention. Referring to FIG. 3, the level shifter L01 is implemented by the fourth transistor M04 in this embodiment. Since the fourth transistor M04 in this embodiment is configured as the source follower, and the output terminal of the source follower, which is the source terminal of the fourth transistor M04, is coupled to the gate terminal of the first transistor M01. Since the source follower has the characteristics of lower gain and wider frequency response, in addition, there is a preset offset voltage between the DC biases of the input terminal and the output terminal of the source follower, and the source follower configured by the fourth transistor M04 can fully respond to the output signal outputted from the output terminal of the amplifying circuit 201 (node B) and shift the DC voltage of the gate terminal of the first transistor M01. Moreover, because the source follower has the characteristic of wider frequency response, there is no need to couple any frequency compensating circuit between the gate terminal and the drain terminal of the first transistor M01 as the second transistor M02.

Referring to FIG. 3, the voltage generator VG10 is implemented by a fifth transistor MOS, a first current source 101 and a bias amplifier BA01, wherein the first current source I01 is implemented by a current mirror configured by a sixth transistor M06, a seventh transistor M07 and an eighth transistor M08, and is used for mirroring the bias current IB provided from the second current source 102 to the first current source 101. A gate bias voltage of the bias amplifier BA01 in the voltage generator VG10 is provided by the gate terminals of the ninth transistor M09 and the tenth transistor M10. Since the positive terminal of the bias amplifier BA01 is coupled to the gate terminals of the ninth transistor M09 and the tenth transistor M10 and the negative terminal thereof is coupled to the drain terminal of the fifth transistor MOS, the drain voltage of the fifth transistor M05 is equal to the gate voltage of the ninth transistor M09 and the tenth transistor M10. The output voltage VG outputted from the output terminal of the bias amplifier BA01 is therefore fixed at an adapted voltage, so that the voltage of the drain terminal of the fifth transistor M05 is equal to the gate voltage of the ninth transistor M09 and the tenth transistor M10.

In addition, since the gate terminal of the fifth transistor M05 is coupled to the gate terminal of the third transistor M03, the gate bias voltage received by the third transistor M03 is equal to the gate bias voltage received by the fifth transistor M05. Thus, the drain voltage of the third transistor M03 is almost equal to the gate voltage of the ninth transistor M09 and the tenth transistor M10. In other word, the gate voltage of the first transistor M01 is equal to the gate voltage of the ninth transistor M09 and the tenth transistor M10. According to the principle of the current mirror, the DC current Iout flowing through the first transistor M01 is proportional to the current $I_{o2}$. Therefore, the DC bias current flowing through the transistor M01 and M02 is predicted.

Referring to FIG. 3, the amplifying circuit 201 is implemented by an eleventh transistor M11, a twelfth transistor M12, a thirteenth transistor M13 and a fourteenth transistor M14. The transistors M11 and M12 are configured as a differential pair, and the transistors M13 and M14 are the active load of the differential pair. To make a comprehensive survey of the structure of the operational amplifier 21, the structure is different from the two stage amplifier in the prior art, and there is no need the folded-cascode configuration. In addition, extra resistor and capacitor for frequency compensation are no longer necessary. Therefore, the present invention and its embodiments can achieve reduction of layout area of the integrated circuit and cost saving.

Figure 4:
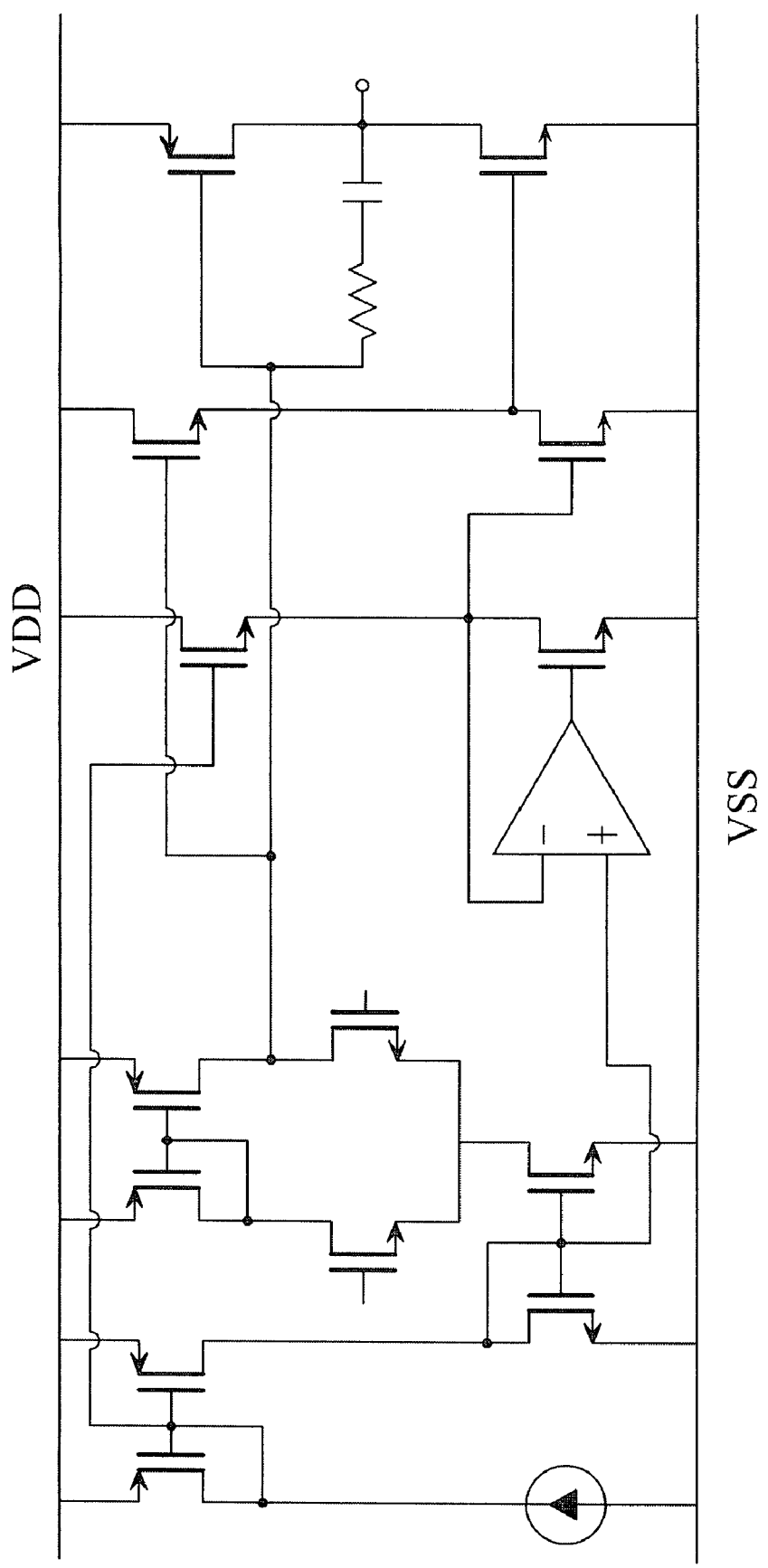
FIG. 4 illustrates another detail circuit diagram of the operational amplifier 21 according to an embodiment of the present invention.

Although it merely provides the circuits in FIG. 2 and FIG. 3 as example in the above-mention embodiment, person having ordinary skill in the art should know that the circuit in FIG. 4 still is a kind of application of the present invention. The difference between the circuit in FIG. 3 and the circuit in FIG. 4 is the exchange of the N type transistors and the P type transistors. The description to the operation thereof is omitted.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. An output stage circuit adapted for enhancing a driving capability of an output signal outputted by an amplifying circuit, the output stage circuit comprising:
   a first transistor, a first source/drain terminal thereof coupled to a first common voltage;
   a second transistor, a first source/drain terminal thereof coupled to a second source/drain terminal of the first transistor, a second source/drain terminal thereof coupled to a second common voltage, a gate terminal thereof coupled to an output terminal of the amplifying circuit;
   an level shifter, comprising a first terminal, a second terminal and a third terminal, wherein the first terminal thereof is coupled to the output terminal of the amplifying circuit and receives the output signal, the second terminal is coupled to the second common voltage, the level shifter is used for shifting the DC voltage of the output terminal of the amplifying circuit a preset voltage, and responding the output signal to the third terminal thereof;
   a frequency compensating circuit, a first terminal thereof coupled to the first source/drain terminal of the second transistor, a second terminal thereof coupled to the gate terminal of the second transistor;
   a third transistor, a first source/drain terminal thereof coupled to the third terminal of the level shifter, a second source/drain terminal thereof coupled to the first common voltage; and
   a voltage generator, for outputting a control voltage to a gate terminal of the third transistor to control a voltage of the first source/drain terminal of the third transistor in order to control a current flowing through the first and the second transistors;
   wherein the voltage generator comprises:
      a fifth transistor, a first source/drain terminal thereof coupled to the first common voltage, a gate terminal thereof coupled to the gate terminal of the third transistor;
      a first current source, a first terminal thereof coupled to a second source/drain terminal of the fifth transistor, a second terminal coupled to the second common voltage; and
      a bias amplifier, a positive terminal thereof receiving a specific gate bias, a negative terminal thereof coupled to the second source/drain terminal of the fifth transistor, an output terminal coupled to the gate terminal of the fifth transistor.

2. The output stage circuit according to claim 1, wherein the level shifter comprises:
   a fourth transistor, wherein a gate terminal thereof corresponds to the first terminal of the level shifter, a first source/drain terminal thereof corresponds to the second terminal of the level shifter, and a second source/drain terminal thereof corresponds to the third terminal of the level shifter.

3. The output stage circuit according to claim 1, wherein the first current source comprises:
   a sixth transistor, wherein a first source/drain terminal thereof corresponds to the first terminal of the first current source, and a second source/drain terminal thereof corresponds to the second terminal of the first current source;
   a seventh transistor, a gate terminal thereof coupled to a first source/drain terminal thereof and a gate terminal of the sixth transistor, a second source/drain terminal coupled to the second common voltage;
   a eighth transistor, a gate terminal thereof coupled to the gate terminal of the seventh transistor, a second source/drain terminal thereof coupled to the second common voltage; and
   a second current source, a first terminal thereof coupled to the first common voltage, a second terminal thereof coupled to the first source/drain terminal of the seventh transistor.

4. The output stage circuit according to claim 3, further comprising:
   a ninth transistor, a first source/drain terminal thereof coupled to the first common voltage, a gate terminal thereof coupled to a second source/drain terminal thereof and the first source/drain terminal of the eighth transistor; and
   a tenth transistor, a first source/drain terminal thereof coupled to the first common voltage, a gate terminal thereof coupled to the gate terminal of the ninth transistor,
   wherein the gate terminal of the ninth terminal provides the specific gate bias.

5. The output stage circuit according to claim 1, wherein the frequency compensating circuit comprises:
   a resistor, wherein a first terminal thereof corresponds to the first terminal of the frequency compensating circuit; and
   a capacitor, wherein a first terminal thereof is coupled to a second terminal of the resistor, and a second terminal thereof corresponds to the second terminal of the frequency compensating circuit.

6. The output stage circuit according to claim 1, wherein the first common voltage is a power source voltage, and a second voltage is a ground voltage.

7. An operational amplifier, comprising:
   an amplifying circuit, wherein an output terminal thereof outputs a output signal; and
   a output stage circuit, comprising:
      a first transistor, a first source/drain terminal thereof coupled to a first common voltage;
      a second transistor, a first source/drain terminal coupled to a second source/drain terminal of the first transistor, a second source/drain terminal thereof coupled to a second common voltage, a gate terminal thereof coupled to the output terminal of the amplifying circuit;
      a level shifter, a first terminal thereof coupled to the output terminal of the amplifying circuit and receiving the output signal, a second terminal thereof coupled to the second common voltage, wherein the level shifter is used for shifting the DC voltage of the output terminal of the amplifying circuit a preset voltage, and responding the output signal to a third terminal thereof;
a frequency, compensating circuit, a first terminal thereof coupled to the first source/drain terminal of the second transistor, a second terminal thereof coupled to the gate terminal of the second transistor;
a third transistor, a first source/drain terminal thereof coupled to the third terminal of the level shifter, a second source/drain terminal thereof coupled to the first common voltage; and
a voltage generator, for outputting a control voltage to a gate terminal of the third transistor to control a voltage of the first source/drain terminal of the third transistor in order to control a current flowing through the first and the second transistors;
wherein the voltage generator comprises:
a fifth transistor, a first source/drain terminal thereof coupled to the first common voltage, a gate terminal thereof coupled to the gate terminal of the third transistor;
a first current source, a first terminal thereof coupled to a second source/drain terminal of the fifth transistor, a second terminal thereof coupled to the second common voltage;
a bias amplifier, a positive terminal thereof receiving a specific gate bias, a negative terminal thereof coupled the second source/drain terminal of the fifth transistor, an output terminal thereof coupled to the gate terminal of the fifth transistor.

8. The operational amplifier according to claim 7, wherein the level shifter comprises:
a fourth transistor, wherein a gate terminal thereof corresponds to the first terminal of the level shifter, a first source/drain terminal thereof corresponds to the second terminal of the level shifter, and a second source/drain terminal thereof corresponds to the third terminal of the level shifter.

9. The operational amplifier according to claim 7, wherein the first current source comprises:
a sixth transistor, wherein a first source/drain terminal thereof corresponds to the first terminal of the first current source, and a second source/drain terminal thereof corresponds to the second terminal of the first current source;
a seventh transistor, a gate terminal thereof coupled to a first source/drain terminal thereof and a gate terminal of the sixth transistor, a second source/drain terminal thereof coupled to the second common voltage;
a eighth transistor, a gate terminal thereof coupled to the gate of the seventh transistor, a second source/drain terminal thereof coupled to the second common voltage; and
a second current source, a first terminal thereof coupled to the first common voltage, a second terminal thereof coupled to a first source/drain terminal of the seventh transistor.

10. The operational amplifier according to claim 9, further comprising:
a ninth transistor, a first source/drain terminal thereof coupled to the first common voltage, a gate terminal thereof coupled to a second source/drain terminal thereof and a first source/drain terminal of the eighth transistor; and
a tenth transistor, a first source/drain terminal thereof coupled to the first common voltage, a gate terminal thereof coupled to the gate terminal of the ninth transistor,
wherein the gate terminal of the ninth transistor provides the specific gate bias.

11. The operational amplifier according to claim 7, wherein the frequency compensating circuit comprises:
a resistor, wherein a first terminal thereof is the first terminal of the frequency compensating circuit; and
a capacitor, wherein a first terminal thereof is coupled to a second terminal of the resistor, and a second terminal thereof is the second terminal of the frequency compensating circuit.

12. The operational amplifier according to claim 7, wherein the first common voltage is a power source voltage and the second common voltage is a ground voltage.

13. The operational amplifier according to claim 10, wherein the amplifying circuit comprises:
a eleventh transistor, a first source/drain terminal thereof coupled to the second source/drain terminal of the tenth transistor, a gate terminal thereof receiving a first input signal;
a twelfth transistor, a first source/drain terminal thereof coupled to the second source/drain terminal of the tenth transistor, a gate terminal thereof receiving a second input signal, a second source/drain terminal thereof outputting the output signal;
a thirteenth transistor, a first source/drain terminal thereof and a gate terminal thereof coupled to a second source/drain terminal of the eleventh transistor, a second source/drain terminal thereof coupled to the second common voltage; and
a fourteenth transistor, a first source/drain terminal thereof coupled to the second source/drain terminal of the twelfth transistor, a second source/drain terminal thereof coupled to the second common voltage, a gate terminal thereof coupled to the gate terminal of the twelfth transistor.

* * * * *